United States Patent
Li

[11] Patent Number: 5,932,007
[45] Date of Patent: Aug. 3, 1999

[54] METHOD AND APPARATUS FOR SECURELY SUPPORTING A GROWING CRYSTAL IN A CZOCHRALSKI CRYSTAL GROWTH SYSTEM

[75] Inventor: Zhixin Li, Hudson, N.H.

[73] Assignee: General Signal Technology Corporation, Stamford, Conn.

[21] Appl. No.: 08/868,405

[22] Filed: Jun. 3, 1997

Related U.S. Application Data

[60] Provisional application No. 60/015,872, Jun. 4, 1996.

[51] Int. Cl.[6] ..................................................... C30B 15/30
[52] U.S. Cl. ......................... 117/208; 117/213; 117/215; 117/218; 117/216
[58] Field of Search ..................................... 117/208, 213, 117/215, 218, 216

[56] References Cited

U.S. PATENT DOCUMENTS

| | | |
|---|---|---|
| 3,511,610 | 5/1970 | Dohmen ...................................... 23/273 |
| 3,607,139 | 9/1971 | Hanks . |
| 3,841,845 | 10/1974 | Keller . |
| 4,017,694 | 4/1977 | King . |
| 4,916,955 | 4/1990 | Katsuoka ............................. 73/862.44 |
| 5,009,865 | 4/1991 | Boden et al. . |
| 5,074,953 | 12/1991 | Shirata .................................... 156/601 |
| 5,126,113 | 6/1992 | Yamagishi ............................. 422/249 |
| 5,335,287 | 8/1994 | Athanas . |
| 5,571,320 | 11/1996 | Grimes et al. . |

FOREIGN PATENT DOCUMENTS

0781875A2   12/1996   European Pat. Off. .

*Primary Examiner*—Robert Kunemund
*Attorney, Agent, or Firm*—Kudirka & Jobse, LLP

[57] ABSTRACT

A puller apparatus for a Czochralski crystal puller system is provided which includes a primary puller chuck and a secondary puller chuck. The primary puller chuck is attached to a seed crystal. The secondary puller chuck is shaped to enclose and retain a portion of a growing crystal so that the growing crystal can be pulled by the secondary puller chuck.

21 Claims, 10 Drawing Sheets

METHOD AND APPARATUS FOR SECURELY SUPPORTING A GROWING CRYSTAL IN A CZOCHRALSKI CRYSTAL GROWTH SYSTEM

CROSS-REFERENCE TO EARLIER APPLICATIONS

This application claims priority of U.S. provisional patent application No. 60/015,872, filed Jun.4, 1996, and entitled, "CRYSTAL STRUCTURE AND METHOD AND APPARATUS FOR PULLING A FORMED CRYSTAL IN A CZOCHRALSKI CRYSTAL GROWTH SYSTEM"

FIELD OF THE INVENTION

This invention relates to forming a solid crystal from a precursor molten composition. More particularly, this invention relates to a solid crystal structure and a method and apparatus for forming the solid crystal structure utilizing a plurality of crystal contact points to which a pulling force on a growing crystal is applied.

BACKGROUND OF THE INVENTION

There are several known techniques for growing solid crystal structures. The Czochralski process is among the most widely used of these techniques. In the Czochralski process, a heated crucible contains a liquid melt form of a charge material from which the crystal is to be grown. The melt is maintained at a temperature slightly above the solidification temperature of the charge material. During the crystal growth process, a crystal seed is placed at one end of a cable (or rod) and positioned in the melt material. Once positioned, the crystal seed is slowly raised out of the melt material (by the cable) and rotated about its longitudinal axis to form the crystal. The seed can be either a sample of the desired crystal material, or any other material that has a higher melting temperature and the same crystal structure as the melt material in its solid form. When the seed is lowered into the melt material, it causes a local decrease in melt temperature that results in a portion of the melt material crystallizing around and below the seed. Thereafter, the seed is slowly withdrawn from the melt and into a crystal growth chamber. As the seed is withdrawn, the portion of the newly formed crystal that remains within the melt essentially acts an extension of the seed and causes melt material to crystallize around and below it. This process continues as the crystal is withdrawn from the melt, resulting in further crystal growth as the seed is continually raised away from the melt.

The crystal is withdrawn from the growth chamber and into a transition chamber (located above the crucible) having a temperature lower than that of the crucible. The crystal finally is drawn from the transition chamber into an elongated receiving chamber shaped to accommodate the extended length of the crystal. The crystal typically is cooled by passing a cooled heat exchange fluid, such a water, through the walls of the transition chamber. This removes both heat from an inert gas surrounding the crystal, and radiant heat emitted from the crystal.

One problem that occurs during the crystal growth process is that crystal lattice defects (commonly referred to as "crystal dislocations") in the seed crystal can propagate throughout the growing crystal. It is known, however, that a dislocation-free silicon crystal may be grown using the Czochralski process if the crystal structure is formed to include a thin neck portion. Such a thin neck portion typically has a relatively small diameter of about 3 to 5 millimeters and must be grown from the seed crystal prior to forming a larger diameter crystal body. One problem with such a thin neck portion, however, is its limited load capacity. The weight of the crystal may exceed the load carrying limit of the crystal neck, thereby causing the crystal neck to break. This problem is particularly serious with large diameter crystals, such as 300–400 millimeter diameter crystals. For example, a crystal neck having a diameter of three millimeters generally can support a maximum crystal body weight of about 143 kilograms. However, a crystal with a 300 millimeter diameter body, for example, often weighs more than 200 kilograms. In such situation, the thin crystal neck of the heavy crystal can fracture, resulting in undesirable interruption of the crystal growing process.

Accordingly, it would be desirable to provide a mechanism for growing a crystal that does not rely on the relatively thin crystal neck to support the load of the entire crystal body. Un addition, it would be desirable to provide such a mechanism in a single, compact unit. Furthermore, it would be desirable to incorporate such a crystal growing mechanism into presently available Czochralski crystal pulling systems. Such mechanism would permit the formation of large diameter, defect free crystal that does not require substantial capital investment for new crystal pulling systems.

SUMMARY OF THE INVENTION

In accordance with one aspect of the invention, an apparatus for forming a crystal structure includes first and second seed chucks for respectively holding first and second parts of the crystal, and first and second pulling mechanisms, which are both supported by a movable platform, for respectively moving the first and second seed chucks. The pulling mechanisms are connected to their respective seed chucks by connectors that may be, for example, conventional cables. The second part of the crystal held by the second seed chuck may be a crystal head, formed during the crystal growth process, having a diameter that is larger than that of a thin neck portion of the crystal. Accordingly, at a predetermined time during the crystal formation process, the second chuck is connected to the larger diameter head portion to support the entire crystal structure. This reduces the possibility of dislocating the growing crystal structure.

In accordance with another aspect of the invention, the first and second pulling mechanisms are incorporated into a single unit. More particularly, as noted above, the first and second pulling mechanisms are both supported by a movable platform that is a part of the apparatus. The platform may rotate to ensure uniform distribution of the crystal melt on the growing crystal. This design is significantly simpler than those of the prior art and thus, more economical to implement and operate.

In accordance with the process of this invention, the crystal structure of this invention is formed by regulating the rate at which a seed crystal is pulled from the melt. More particularly, the crystal is pulled by the first seed chuck into contact with the second chuck so that the crystal head is retained within the second chuck in a manner that prevents it from moving to a position outside the second chuck. The second chuck then is pulled away from the melt at a rate that permits formation of the crystal body having a desired diameter. After the crystal is formed and has cooled sufficiently, it is recovered from the crystal pulling system.

DESCRIPTION OF THE ILLUSTRATIVE EMBODIMENT

Figure 1:
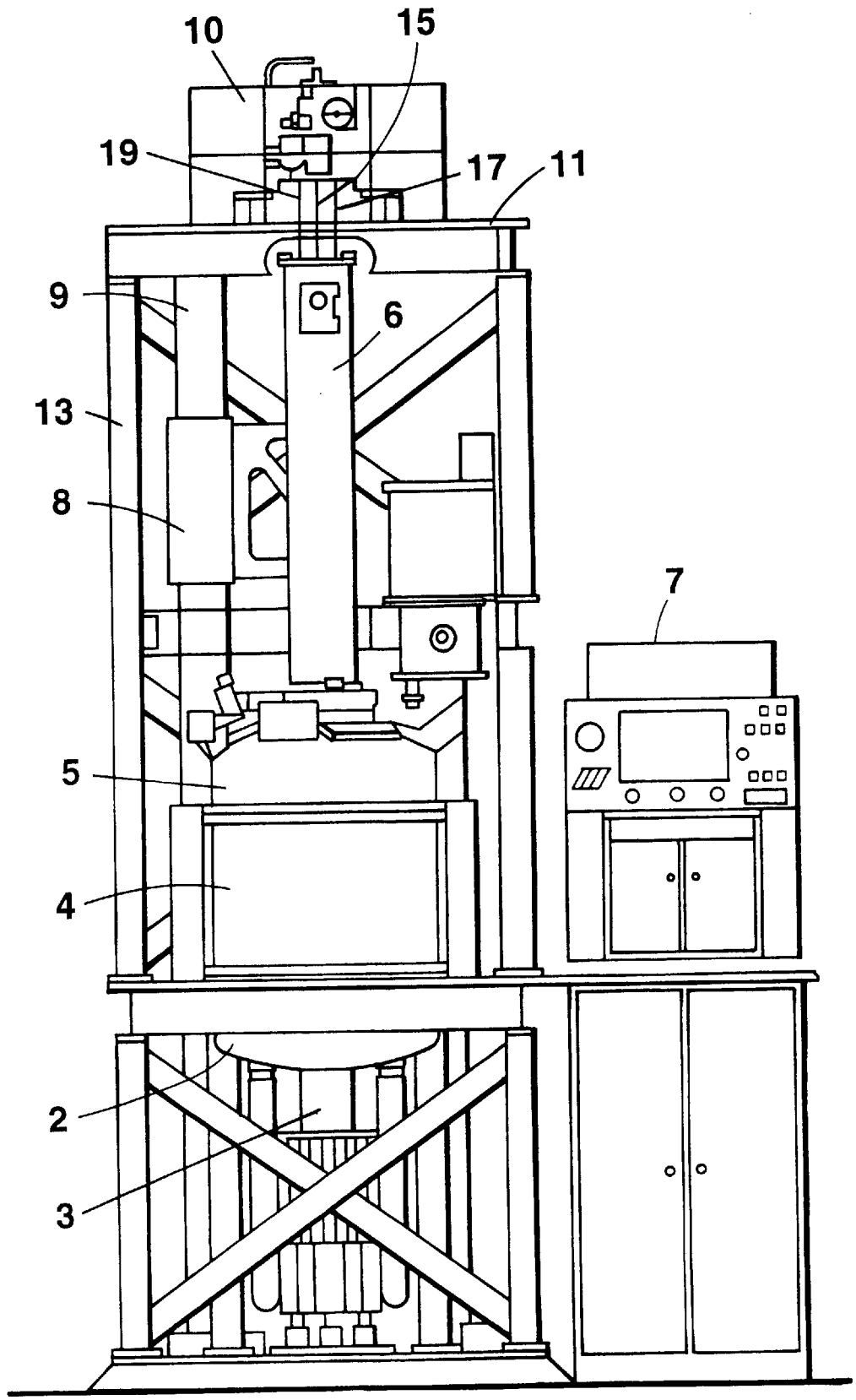
FIG. 1 is a side view of a crystal pulling system utilizing the present invention.

A crystal pull system 1 utilizing the present invention is illustrated in FIG. 1. The crystal pull system 1 includes a base chamber 2 that houses a crucible 12 (shown in detail in FIG. 2). A crucible lift 3 extends into the base chamber 2 and adjusts the position of the crucible 12 within the base chamber 2. The crystal pull system 1 also includes a growth chamber 4 wherein a liquid composition is converted to a crystalline solid composition, and a transition chamber 5. A receiving chamber 6 for receiving the emerging crystal from the transition chamber 3 is positioned above the transition chamber 5. A control system 7 monitors various parameters of the crystal growth process, such as melt level in the crucible 12, the temperature in a plurality of areas within the transition chamber 5, and the rate the seed is withdrawn from the melt.

Figure 4:
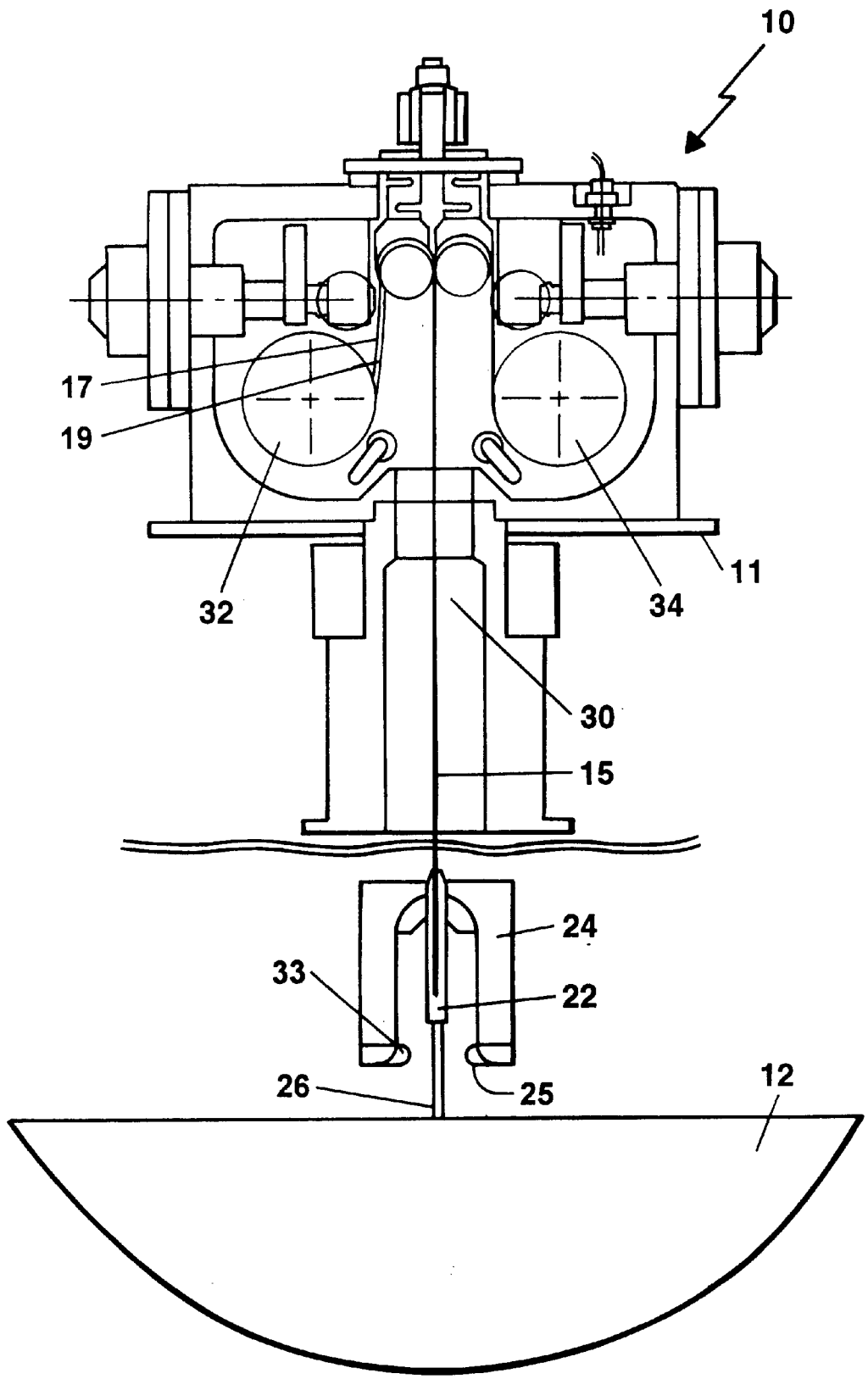
FIG. 4 is front view of the apparatus of this invention.
Figure 5:
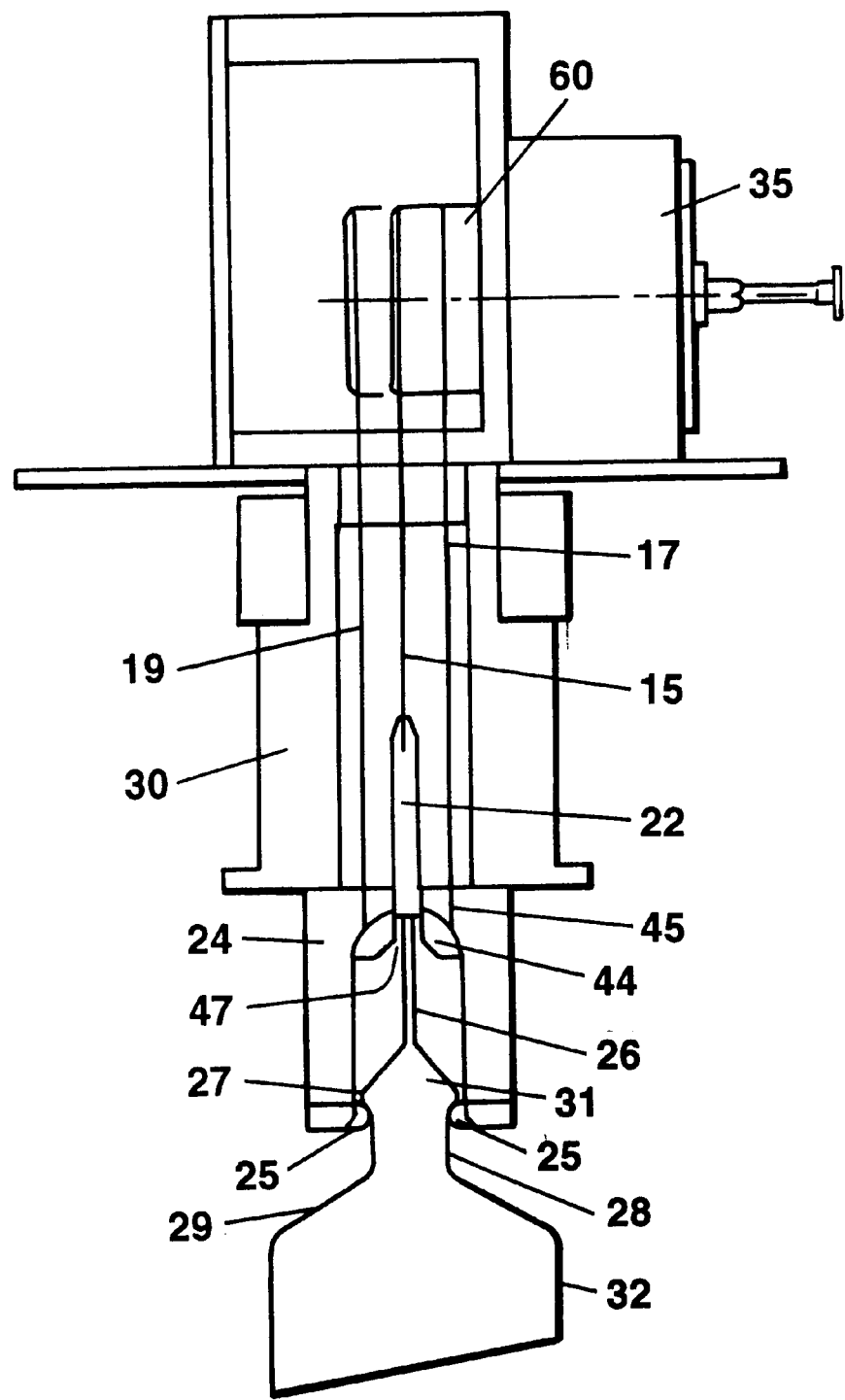
FIG. 5 is a side view of the apparatus of this invention.

A lift mechanism 8 that is movable along a guide rod 9 under the control of the control system 7 is utilized to rotate the combination of the growth chamber 4 and the transition chamber 5 about the longitudinal axis of the guide rod 9. Accordingly, when the combination is detached from the remaining portion of the crystal growth system 1, the combination structure may be placed away from the base chamber. Alternatively, the lift mechanism 8 can be configured to move only the receiving chamber 6 so that the crystal positioned within the receiving chamber 6 can be recovered. The system 1 further includes a pull head 10 positioned on a movable platform 11 that is connected to a frame 13, and a primary cable 15 connected between the pull head 10 and a primary seed chuck 22 (FIGS. 4 and 5). The primary seed chuck is connected to a seed crystal. Similarly, secondary cables 17 and 19 are connected between the pull head 10 and a secondary seed chuck 24 (FIGS. 4 and 5).

The control system 7 may be a software driven controller that controls the position of the primary seed chuck 22 relative to the secondary seed chuck 24. In the preferred embodiment, the lift speed of the primary chuck 22 is linearly related to the lift speed of the secondary chuck 24. This linear relationship may be entered into the control system 7 by a user, or programmed as a default value. In the preferred embodiment, the ratio of the lift speed of the secondary chuck 24 to the lift speed of the primary chuck 22 is between about 0.9 and 1.2. This ratio may be dynamically changed to another value once the crystal reaches a preselected weight. The weight may be determined by a cable sensor (not shown) and fed back into the control system 7. Details of the control system are discussed below with reference to FIGS. 10A, 10B, and 11.

Figure 2:
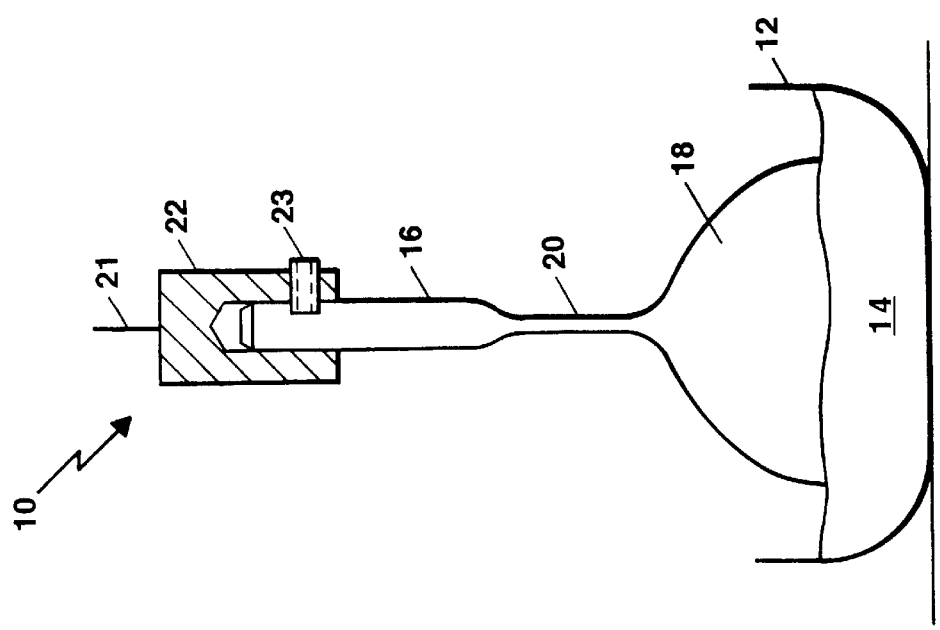
FIG. 2 is a side view of a crystal structure of the prior art.

FIG. 2 shows a prior art crystal structure for producing a single silicon crystal. The crucible 12 containing the molten silicon 14 is positioned within the base chamber 2 of the system 1. A cable 21 is attached to the seed chuck 22 which, in turn, is secured to seed crystal 16 by set screw 23. The seed crystal 16 is lowered vertically into contact with the molten silicon 14 in the crucible 12 to initiate growth of a silicon crystal 18. The cable 21 and seed crystal 16 then are pulled upwardly from the molten silicon 14 by a motor (not shown) in the pull head 10. An elongated single crystal 18 may be grown when the seed crystal 16 is withdrawn from the molten silicon 14 and properly rotated about its longitudinal axis at the proper rate. To ensure cross-sectional uniformity, both the seed crystal 16 and the crucible 12 holding the silicon 14 preferably are rotated during the pulling process. As shown in FIG. 2, the crystal neck 20 has a significantly smaller diameter than the crystal body 18. Generally, the crystal neck diameter is between about 3 mm and about 5 mm while the crystal body has a diameter between about 100 mm and about 400 mm. Due to the significantly different cross-sectional areas of the crystal neck 20 and the crystal body 18, the crystal neck 20 can support only a limited length of crystal body 18 before the weight of the crystal body 18 will cause the crystal neck 20 to fracture. The crystal neck 20 generally is formed to have a length between about 100 mm and about 500 mm to prevent dislocation growth within the crystal body 118. Generally, the rate at which the crystal neck 20 is pulled from the silicon melt 14 in order to achieve these dimension is between about 1 mm/min and about 10 mm/min, more usually between about 2.0 m/min and about 5 mm/min. Thereafter, the rate at which the seed crystal 16 is pulled vertically from the silicon melt 14 is reduced to a rate of between 0.2 mm/min and about 4 mm/min, and more usually between about 0.5 mm/min and about 1.5 mm/min to produce the crystal body 18 having a desired.

Figure 3:
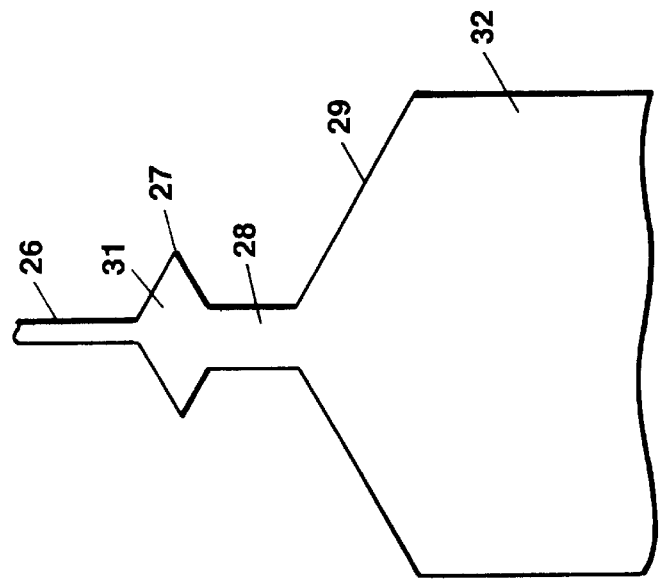
FIG. 3 is a side view of the crystal structure of this invention.

Referring to FIG. 3, the crystal structure of this invention includes a crystal neck 26 having a diameter between about 3 mm and about 5 mm and a length at least about 100 mm to provide a crystal neck size which prevents the formation of dislocations in the subsequently grown crystal. The crystal structure also includes a crystal head 31 attached to crystal neck 26 and having a largest diameter 27 between about 25 mm and about 60 mm, preferably between about 35 mm and about 45 mm. The crystal head 31 also is attached to secondary crystal neck 28 having a diameter intermediate the diameter of crystal neck, 28 and the head diameter 27. The secondary crystal neck 26 has a diameter between about 10 mm and about 20 mm preferably between about 14 mm and about 16 mm. The crystal body 32 is connected to the secondary crystal neck 28 and has a diameter to provide a crystal body weight which can be supported by the secondary neck 28. Suitable crystal body diameters are between about 200 mm and about 450 mm, preferably between about 300 mm and about 310 mm. The juncture of secondary neck 28 and crystal head 31 provides a surface to which the secondary seek chuck 24 can be contacted in order to support and pull a growing crystal body described in more detail below with reference to FIG. 5.

FIGS. 4 and 5 show the interior of the inventive system 1, which includes the primary seed chuck 22 and the secondary seed chuck 24. FIG. 4 illustrates a primary pull head mechanism 34 that draws the primary cable 15 upwardly. The primary cable 15 is attached to the primary seed chuck 22 which, in turn, pulls the seed crystal upwardly from the molten silicon in crucible 12. The primary seed chuck 22 is shown in this figure to be near the lower end of its travel during the phase when the primary crystal neck 26 is formed. The cable 15 passes through a conventional ferrofluid seal 30 prior to reaching the pull head 10. The ferrofluid seal 30 seals the cable 15 to support a vacuum within the crystal forming system 1. The ferrofluid seal 30 may be a conventional ferrofluidic hollow shaft seal, such as a FERROSEAL ™ seal, available from Ferrofluidics Corporation of Nashua, N. H.

In accordance with one aspect of the present invention, the secondary seed chuck 24 surrounds the primary seed chuck 22. The secondary seed chuck 24 may be cylindrical in cross-section or may be formed of a plurality of discrete arms such as two arms forming a U-shaped chuck structure. The primary seed chuck 22 slides through a hole in the secondary seed chuck 24. The secondary seed chuck 24 is supported on cables 17 and 19 (discussed in more detail below with reference to FIG. 5) which also pass through the ferrofluid seal 30. A secondary drive mechanism 32 pulls the cables 17 and 19 and the attached secondary seed chuck 24 upwardly. Both the primary drive mechanism 34 and secondary drive mechanism 32 are mounted on the rotatable platform 11. This simplifies the design since both drive mechanisms 32 and 34 rely on the single platform to rotate the seed crystal. A "one-way" gate 33 comprising a plurality of fingers 25 to secure the crystal (shown in greater detail in FIG. 8) is positioned at the lower end of the secondary seed chuck 24.

Figure 8:
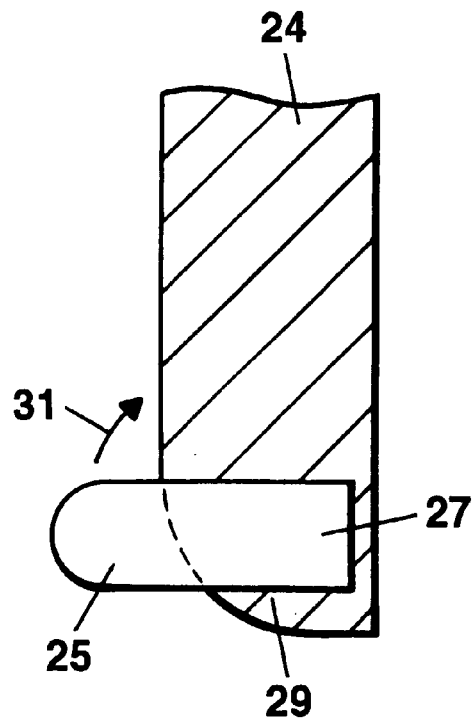
FIG. 8 is a partial cross-sectional view of the one-way gate utilized with the apparatus of this invention.

Referring to FIG. 8, a portion of the secondary seed chuck 24 is shown in partial cross-section. Each finger 25 is pivoted about a rod 27 that functions as a pivot point. The fingers 25 thus may swing upwardly in the direction shown by arrow 31. However, a stop pin 29 or other similar mechanism prevents the fingers 25 from swinging downwardly toward the silicon melt 14. The fingers 25 preferably can be spring loaded to urge them against the stop pin 29. As discussed below, the fingers 25, which form the one-way gate, catch and secure the crystal, head 31 having a largest diameter at the circumference 27. The circumference 27 is sized so that it can pass through the fingers 25 and, after having passed through them, be supported by the fingers 25 when they are in their extended position pointing radially inwardly. The diameter of the circumference 27 and the diameter of the secondary crystal neck 28 are sized so that fingers 25 retain the crystal head 31 within the secondary chuck 24.

FIG. 5 shows a side view of the system I illustrating the seed chucks 22 and 24 at the upper end of their travel when they reach a position adjacent to ferrofluid seal 30. To compensate for small differences in the cable length of cables 17 and 19, they are attached to ball joint mechanism in secondary seed chuck 24. In particular, the cables 17 and 19 terminate in a hemispherical retainer 44 when the seed chuck 24 is cylindrical, or in a cylindrical retainer 44 when the secondary seed chuck 24 is U-shaped. The retainer 44 fits into a matching curved recess in the top of the secondary seed chuck 24. The retainer 44 and the secondary seed chuck 24 therefore can move relative to each other. Pnmriary seed chuck 22 passes through a hole in the retainer 44. The secondary cables 17 and 19 are drawn upwardly by a drum 62 in the pull head 10 by a conventional pulling mechanism (shown in FIG. 5) whereas the primary seed cable 15 is drawn by a separate drum 60 that is controlled by a conventional pulling mechanism 35.

FIG. 5 also illustrates effects of the controlled growth of the crystal to produce the retaining crystal head 31 that is retained within the secondary chuck 24. In particular, crystal growth is begun in a conventional fashion when primary seed chuck 22 and seed crystal 16 are lowered into the molten silicon, 14. The seed crystal 16 is withdrawn at a rate to grow a crystal neck 26 with a sufficiently small diameter so as to avoid the above noted crystal dislocation problems. After the crystal neck 26 is grown, the pulling speed of the primary seed chuck 22 and the crystal growth temperature are adjusted to increase the diameter of the crystal. This adjusted speed produces the retaining crystal head 31. A suitable seed withdrawal rate to form crystal head 31 is between about 1 mm/min and about 6 mm/min, preferably between about 2 mm/min and about 3 mm/min. Thereafter, the pulling speed and crystal growth temperature are further adjusted to decrease the crystal diameter, thereby producing the retaining neck portion 28. A suitable seed withdrawal rate to form secondary neck 28 is between about 1 mm/min and about 10 m/min, preferably between about 2.0 mm/min and about 5.0 mm/min. At this time, the retaining head 31 and the crystal neck 28 are supported by the crystal neck 26. However, after the retaining crystal neck portion 28 is grown, the secondary chuck 24 remains stationary in roughly the position shown in FIG. 4. Consequently the retaining crystal head 31 of the crystal enters the secondary chuck mechanism 24. As the retaining crystal head portion 31 passes by the fingers 25, the fingers 25 are pushed upwardly toward the pull head 10 and swing readily outwardly to permit the retaining crystal head 31 to pass the fingers 25. However, when the secondary neck 28 passes by the fingers 25, the crystal diameter is sufficiently small so that the fingers 25 swing downwardly toward the molten silicon, thereby trapping the retaining crystal head at diameter 31 within the secondary chuck 24 (as shown in FIG. 5).

After the retaining crystal head 31 becomes secured inside the secondary chuck 24, the pulling process is continued by the secondary pull head 32. Since both the primary seed chuck 22 and the secondary seed chuck 24 have independent drives and control mechanisms that can be independently programed, the speed and position of each of the primary seed chuck 22 and the secondary seed chuck 24 can be precisely and separably controlled relative to each other. Consequently, a smooth transition from the pulling portion generated by the primary seed chuck 22 to the pulling portion generated by the secondary seed chuck 24 can be accomplished with minimal interference to the crystal growth process.

Pulling thus is continued with the secondary seed chuck 24 and the secondary crystal neck 28 now supporting the weight of the growing crystal 32 rather than crystal neck 26. Since the secondary crystal neck 28 has a considerably larger diameter than the seed neck 26, a larger diameter crystal 32 can be safely grown without the risk of breaking the thin seed neck 26. More specifically, after the retaining crystal head 31 has engaged the secondary chuck 24, the shoulder 29 and crystal body 32 are grown to conventional diameters or larger by reducing the rate at which the solid crystal is withdrawn from the molten silicon to less than about 2 mm/min, preferably between about 0.5 mm/min and about 1.5 mm/min.

Figure 6:
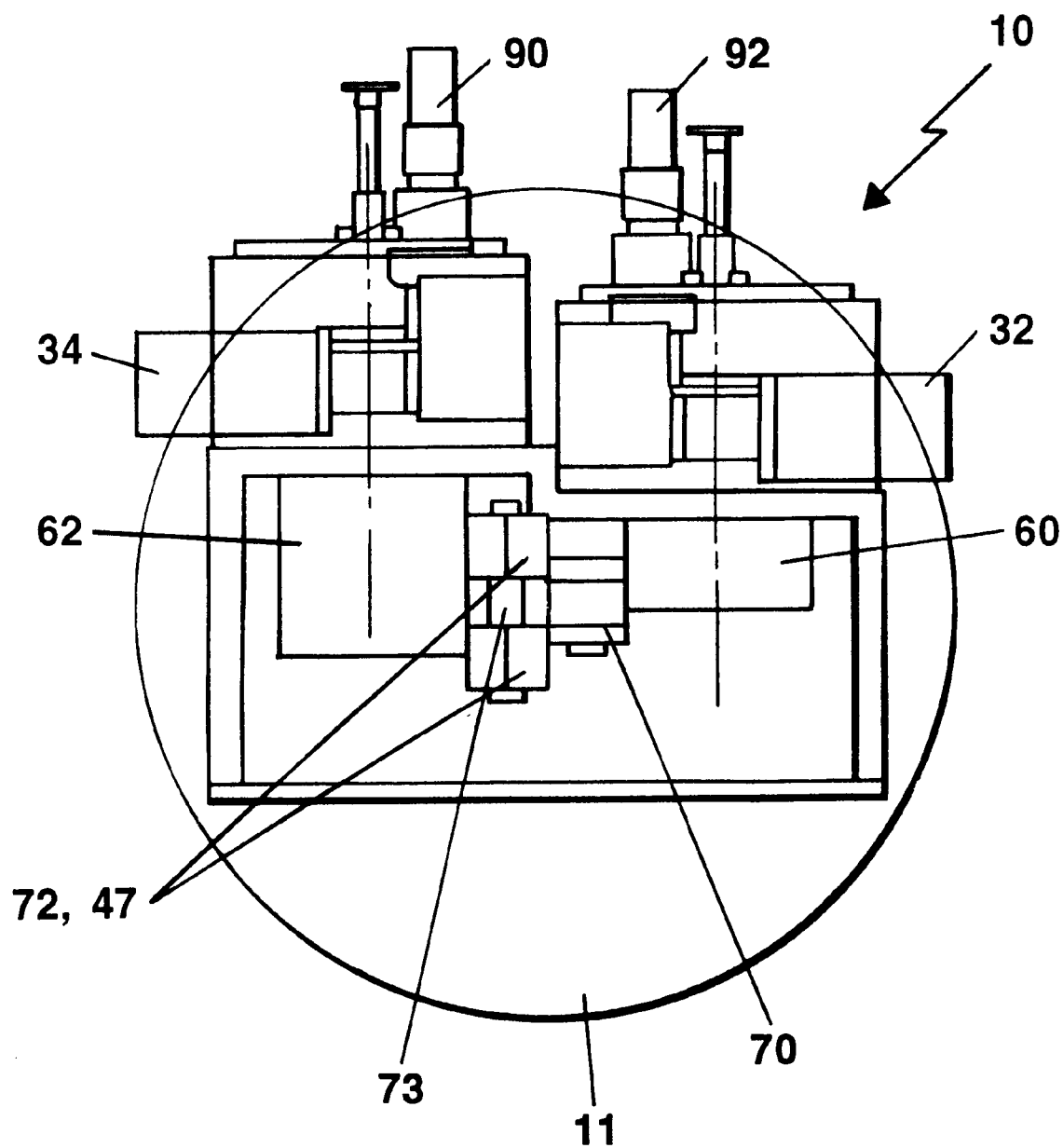
FIG. 6 is top view of the actuating means utilized with the apparatus of this invention.
Figure 7:
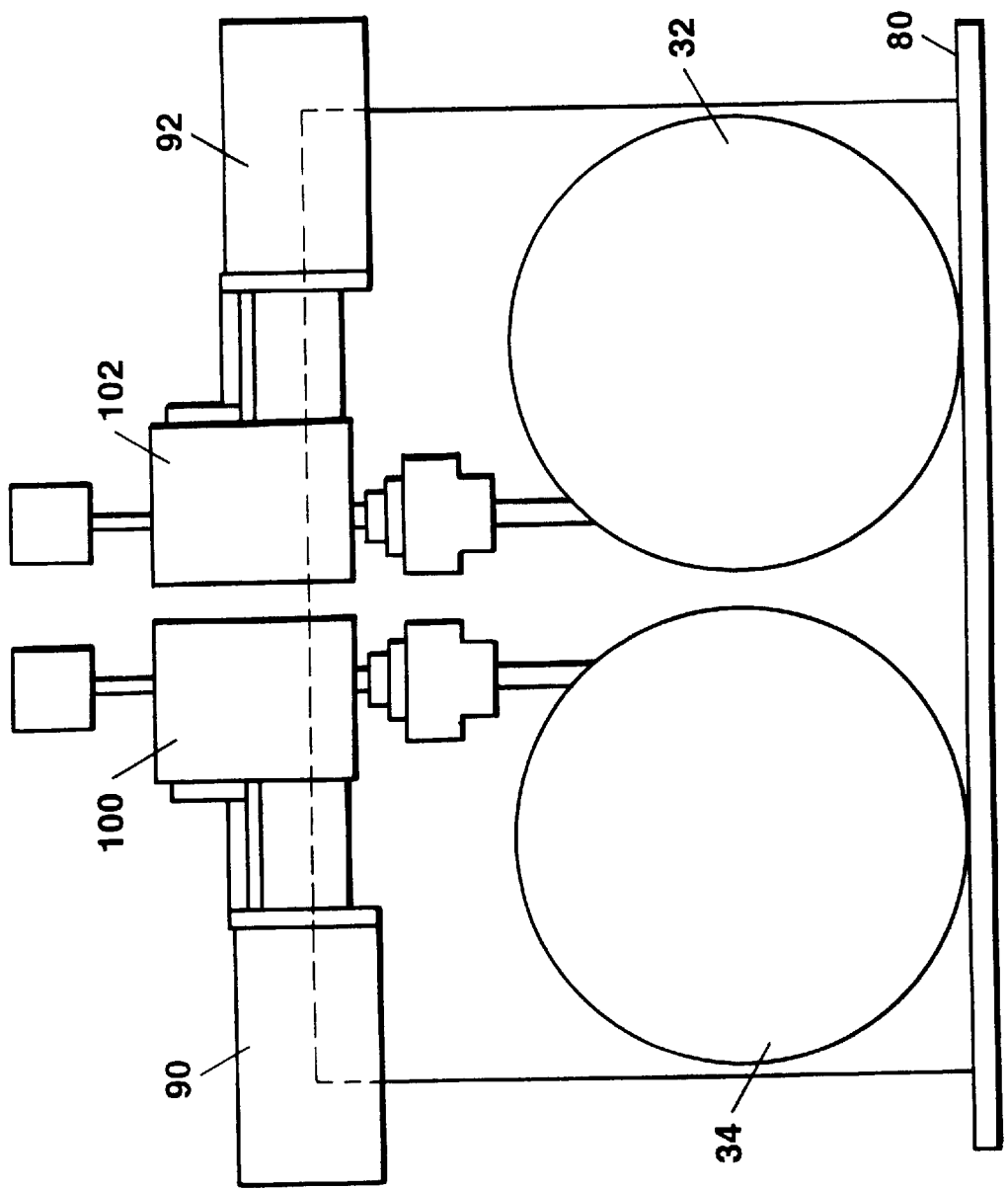
FIG. 7 is rear view of the actuating means utilized with the apparatus of this invention.

FIGS. 6 and 7 illustrate the details of an exemplary pull head 10 that can accommodate two seed chucks in accordance to the principles of this invention. The pull head 10 is mounted on rotatable platform 11 so that it can be rotated about the axis of the pulling cable in a conventional fashion. The two pulling mechanisms 32 and 34 are provided, each of which comprise gear reduction apparatus 100 or 102 driven by motors 90 or 92, respectively. As shown in FIG.

5, the primary gear reduction mechanism 102 drives a primary drum 60. The primary seed chuck cable 15 preferably is wound on the primary drum 60 after it passes through the ferrofluid seal 30 and over a primary pulley 70. Secondary seed chuck cables 17 and 19 pass through the ferrofluid seal apparatus 30 and over secondary pulleys 72 and 74 that are arranged on a common shaft 73. Both cables 17 and 19 are wound around a single, double-wide drum 62. The drum 62 is driven by the gear reduction mechanism 34 and by the motor 90. The primary drum 60 and the secondary drum 62 are arranged to have the same travel so that, after the secondary seed chuck 24 has engaged the retaining crystal head 31, both drums 60 and 62 can be driven at the same speed. This causes the primary seed chuck 22 and the secondary seed chuck 24 to travel together as the main crystal body 32 is grown.

Figure 9:
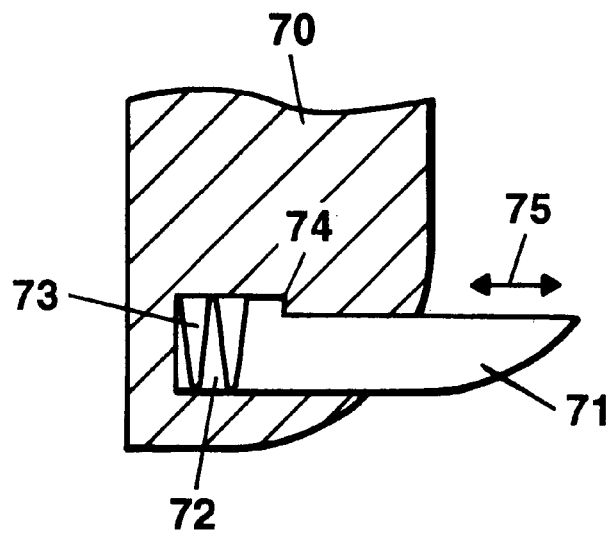
FIG. 9 is a partial cross-sectional view of an alternative one-way gate utilized with the apparatus of this invention.

FIG. 9 shows an alternative secondary chuck structure 70 in cross section having a single finger 71. The finger 71 is positioned within recess 72 against spring 73 and is moveable in the directions of arrow 75. When a crystal head 31 is pulled into contact with the fingers 71, they are pushed toward spring 73 and from the crystal head 31 to permit the crystal head to by-pass the fingers 71. After the head 31 has completely by-passed the fingers 71 so that secondary neck 28 is contiguous with the fingers 71, the spring 73 pushes the finger 71 into contact with the junction between the head 31 and the secondary neck 28 so that the fingers 71 support the crystal head 31. Stop 74 is provided to retain the finger 71 within the recess 72.

Figure 10A:
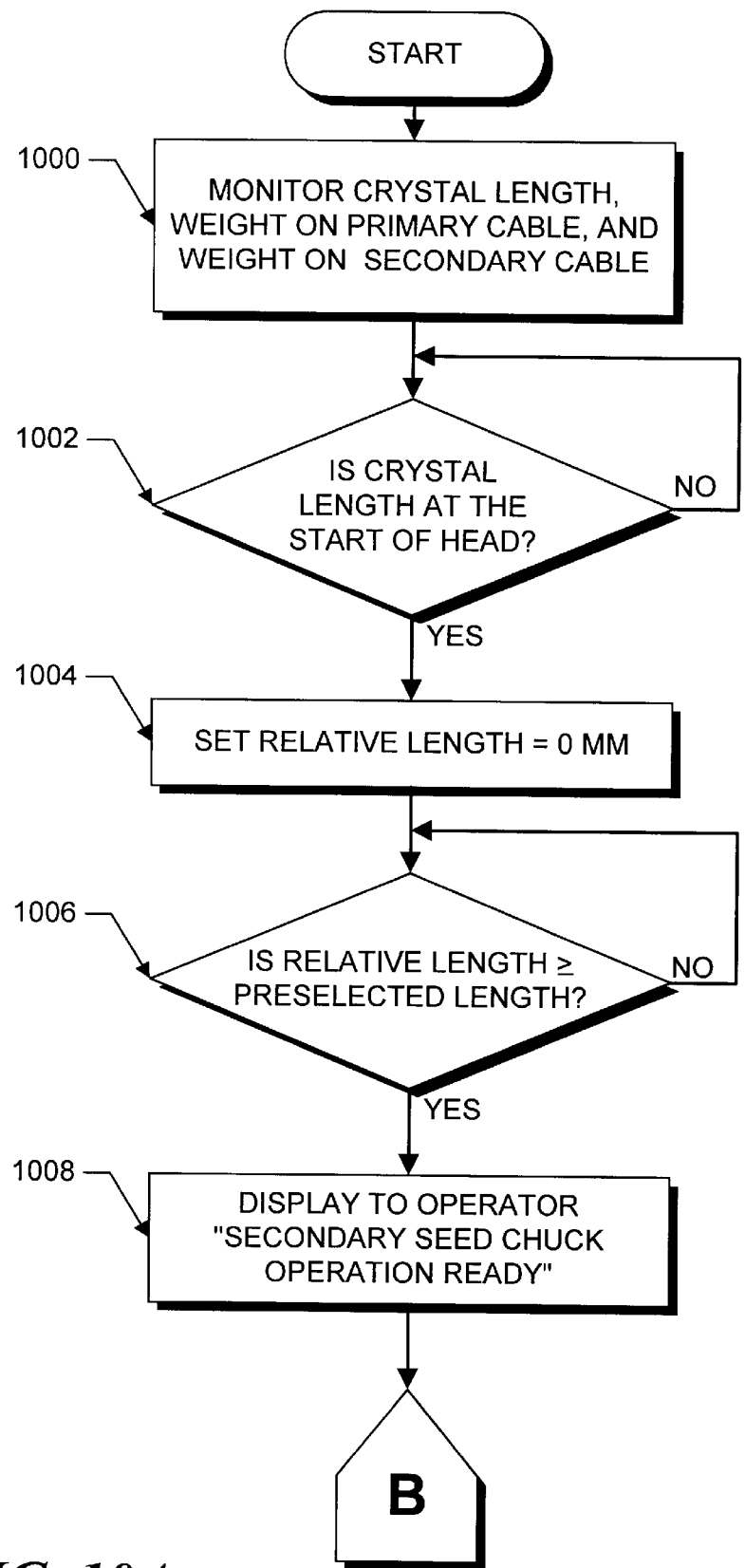
FIGS. 10A and 10B together form a flow chart summarizing the steps for securing the secondary seed chuck to the crystal.
Figure 10B:
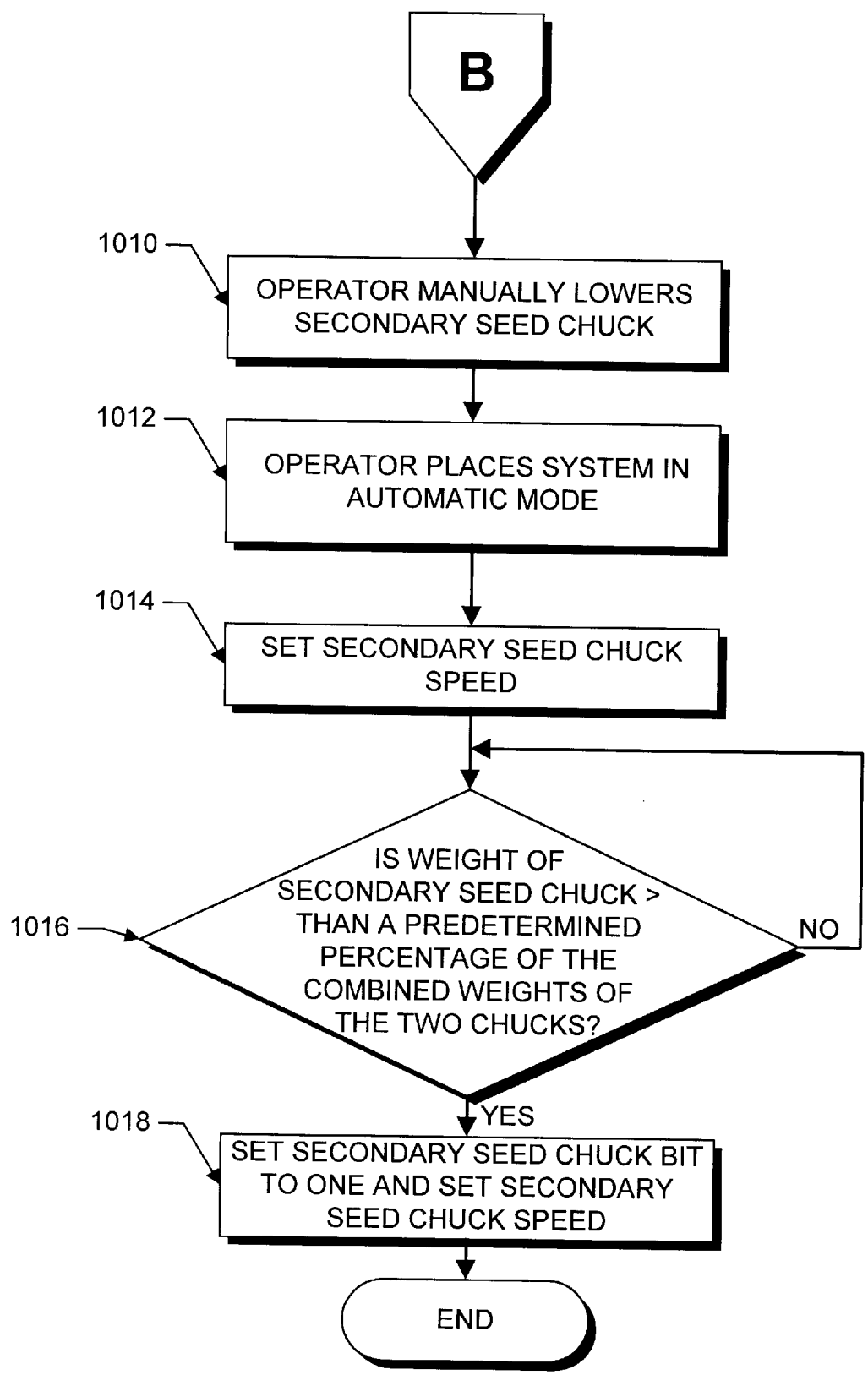

FIGS. 10A and 10B show a process that may be used by the control system 7 for securing the crystal head 31 to the secondary seed chuck 24. The process begins at step 1000 where the control system 7 monitors the crystal length, the weight on the primary seed chuck cable 15, and the weight on the secondary seed chuck cables 17 and 19. The weight on each of cables 15, 17, and 99 which support the seed chucks 22 and 24 is measured with load cells in the respective winch mechanisms in a conventional manner. At this time, the control system 7 is in an "automatic" mode in which it controls the rate at which the primary seed cable is raised in order to control crystal growth in accordance with a predetermined formula.

At step 1002, it is determined whether the crystal length is such that crystal growth is taking place at the start of the crystal head 31. If the crystal is at that length, a "relative length" variable is set to 0 millimeters at step 1004 and the crystal length is monitored. The relative length variable is increased as the crystal grows until the crystal head 31 has reached a preselected length value. It then is determined at step 1006 if the value of the relative length variable of the crystal 18 is greater than or equal to a predetermined head length value. This value may be selected based on prior experimentation. If yes, then the process continues to step 1008 in which the control system 7 displays to the operator of the crystal pull system 1 that the crystal head 31 has sufficient length to be secured to the secondary seed chuck 24. At this time, the operator places the control system 7 in a "manual" mode so that the secondary seed chuck can be manually lowered into position.

The process continues with off page connector "B" to step 1010, where the operator manually controls the control system 7 to lower the secondary seed chuck 24 into position. The operator lowers the secondary seed chuck while monitoring its vertical position until it reaches a predetermined position relative to the crystal head. This predetermined position is relative to the crystal head length which has been, in turn, determined in step 1006.

The operator then places the control system 7 back into "automatic mode," in which the control system 7 now controls simultaneous movement of the two seed chucks 22 and 24 (step 1012).

The process then continues to step 1014 in which the speed of the secondary seed chuck 24 is set by the control system 7 to be equal to a first constant (greater than 1.0) times the speed of the primary seed chuck 22 so that the secondary seed chuck is drawn up at a faster rate than the primary seed chuck. Eventually, the secondary seed chuck engages the crystal head 31 as previously described. After the secondary seed chuck is engaged, the overall weight of the crystal gradually transfers from the primary seed chuck to the secondary seed chuck. At step 1016, it then is determined if the weight carried by the secondary seed chuck 24 is greater than a predetermined percentage of the crystal weight (as measured by the combined weights of the primary and secondary seed chucks 22 and 24.) If yes, then a "secondary seed chuck caught crystal" flag bit is set in the control system 7 and the speed of the secondary seed chuck 24 is set to a second constant times the speed of the first seed chuck 22 (step 1018). This second constant is substantially "one" so that the secondary and primary seed chucks are drawn up at the same speed, thus ending the secondary seed chuck engagement process.

Figure 11:
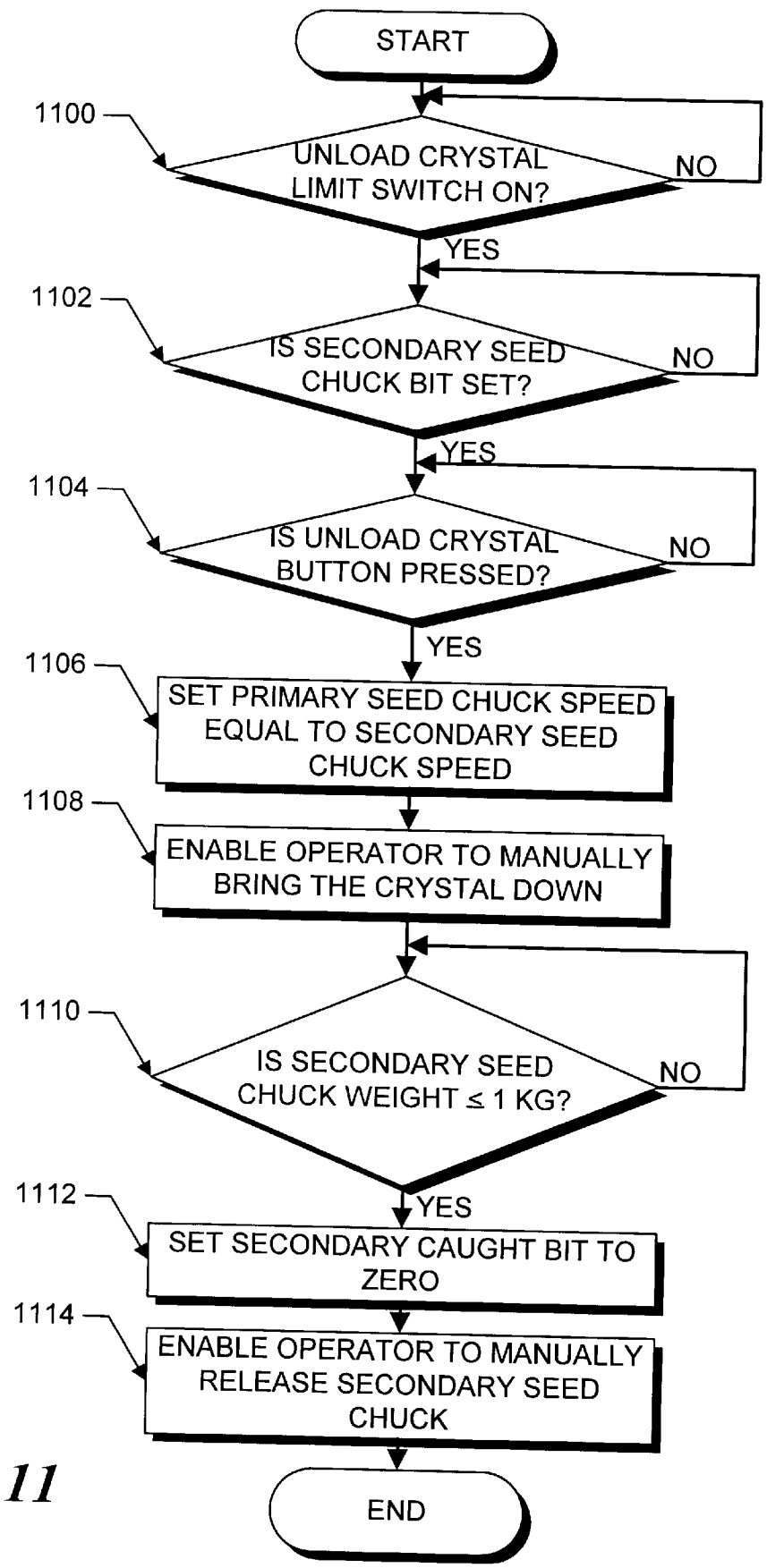
FIG. 11 is a flow chart summarizing the steps for unloading the crystal from the apparatus of this invention.

FIG. 11 is a flow chart summarizing the steps for unloading the crystal 18 from the crystal pull system 1. The process starts at step 1100 where the control system 7 ascertains if an unload crystal limit switch (not shown) is on. Such switch typically is on when the crystal 18 is at the top of its travel within the crystal pull system 1. If the switch is on, it then is determined if the secondary seed chuck caught crystal flag bit is set to one (step 1102) which indicates that the secondary seed chuck had properly engaged the crystal during the previously-described process.

If the flag bit is set, then it is determined at step 1104 if an unload crystal button (not shown) has been pressed by the operator indicating that an unload operation is beginning. If such button is pressed, then at step 1106, the primary seed chuck speed is set to be equal to the speed of the secondary seed chuck 24 and both chucks can be lowered simultaneously. At step 1108, the control system 7 enables the operator to manually bring the chucks and the crystal 18 down so that the crystal 18 eventually rests on a support (not shown). During this period, the weight on the secondary seed chuck cables is monitored.

It then is determined at step 1110 if the weight on the secondary seed chuck cables 17 and 19 is less than or equal to one kilogram. If it is less than or equal to one kilogram, the process continues to step 1112 where the secondary seed chuck caught crystal bit is set to zero. At step 1114, the operator then manually releases the crystal from the secondary seed chuck 24, thereby completing the unload process.

The inventive arrangement described above comprises a relatively compact design which does not significantly increase the height, width or depth of the pull head over conventional designs. In addition, many components are shared between the primary and secondary pull systems, reducing the manufacture cost of the inventive mechanism. Other conventional mechanisms such as a cable antislipping mechanism can be added to the inventive pull head design.

What is claimed is:

1. An apparatus for forming a crystal structure, the apparatus comprising:

a hermetic vessel having an interior and an exterior and enclosing the crystal structure during formation;

a first seed chuck for holding a first part of the crystal structure;

a second seed chuck having a gate for holding a second part of the crystal structure;

a first pulling mechanism positioned on the vessel exterior;

a second pulling mechanism;

a first connector for connecting the first pulling mechanism to the first seed chuck, the first pulling mechanism moving the first seed chuck;

a second connector for connecting the second pulling mechanism to the second seed chuck, the second pulling mechanism moving the second seed chuck; and a rotating platform positioned on the vessel exterior and supporting the first pulling mechanism and the second pulling mechanism.

2. The apparatus for forming a crystal structure as defined by claim 1 further including a control system for controlling the operation of the first pulling mechanism and the second pulling mechanism.

3. The apparatus for forming a crystal structure as defined by claim 2 wherein the control system controls a movement of the first connector relative to the second connector.

4. The apparatus for forming a crystal structure as defined by claim 3 wherein the first pulling mechanism has a first lift speed and the second pulling mechanism has a second lift speed, the control system causing the first lift speed to be proportional to the second lift speed by a fixed constant.

5. The apparatus for forming a crystal structure as defined by claim 1 wherein the crystal structure is silicon.

6. The apparatus for forming a crystal structure as defined by claim 1 further including a third connector for connecting the second pulling mechanism to the second seed chuck.

7. The apparatus for forming a crystal structure as defined by claim 6 further including a ball joint mechanism connected to the second connector and third connector.

8. The apparatus for forming a crystal structure as defined by claim 1 wherein the second part of the crystal structure includes a crystal head, the second seed chuck being connected to the crystal head.

9. The apparatus for forming a crystal structure as defined by claim 1 wherein the gate includes a protrusion.

10. The apparatus for forming a crystal structure as defined by claim 1 wherein the second seed chuck defines an internal volume, the first seed chuck being within the internal volume.

11. The apparatus for forming a crystal structure as defined by claim 1 wherein the first and second connectors include a cable.

12. An apparatus for securely gripping a crystal in a Czochralski crystal growing system having a hermetic vessel with an interior and an exterior and enclosing the crystal during formation, a rotating platform positioned on the vessel exterior, a first seed chuck for holding a first part of the crystal structure, a first pulling mechanism having a first drum positioned on the rotating platform, the first drum rotating about a first axis and a first cable connecting the first drum to the first seed chuck, the apparatus comprising:

a second seed chuck for holding a second part of the crystal;

a second pulling mechanism having a second drum positioned on the rotating platform, the second drum rotating about a second axis and a third drum positioned on the rotating platform, the third drum rotating about a third axis collinear with the second axis and parallel to the first axis;

a second cable for connecting the second drum to the second seed chuck; and a third cable for connecting the third drum to the second seed chuck.

13. The apparatus as in claim 12 wherein the first, second and third cables lie in a plane parallel to the first, second and third axes.

14. The apparatus for forming a crystal structure as defined by claim 12 further including a control system for controlling the operation of the first pulling mechanism and the second pulling mechanism.

15. The apparatus for forming a crystal structure as defined by claim 14 wherein the control system controls the movement of the first connector relative to the second connector.

16. The apparatus for forming a crystal structure as defined by claim 15 wherein the first pull head has a first lift speed and the second pull head has a second lift speed, the control system causing the first lift speed to be proportional to the second lift speed by a fixed constant.

17. The apparatus for forming a crystal structure as defined by claim 12 wherein the crystal structure is silicon.

18. The apparatus for forming a crystal structure as defined by claim 12 further including a ball joint mechanism connected to the second cable and third cable.

19. The apparatus for forming a crystal structure as defined by claim 12 wherein the second part of the crystal structure includes a crystal head, the second seed chuck being connected to the crystal head.

20. The apparatus for forming a crystal structure as defined by claim 12 wherein the gate includes a protrusion.

21. The apparatus for forming a crystal structure as defined by claim 12 wherein the second seed chuck defines an internal volume, the first seed chuck being within the internal volume.

* * * * *